United States Patent [19]

Homma

[11] Patent Number: 5,405,805
[45] Date of Patent: Apr. 11, 1995

[54] METHOD FOR FORMING INTERCONNECT STRUCTURE, INSULATING FILMS AND SURFACE PROTECTIVE FILMS OF SEMICONDUCTOR DEVICE

[75] Inventor: Tetsuya Homma, Tokyo, Japan
[73] Assignee: NEC Corporation, Tokyo, Japan
[21] Appl. No.: 943,069
[22] Filed: Sep. 10, 1992

[30] Foreign Application Priority Data

Sep. 13, 1991 [JP] Japan .................................. 3-234238
Sep. 24, 1991 [JP] Japan .................................. 3-242239
Sep. 30, 1991 [JP] Japan .................................. 3-250781

[51] Int. Cl.6 .......................................... H01L 21/441
[52] U.S. Cl. ..................................... 437/195; 437/235
[58] Field of Search ................. 437/195, 225, 228, 235

[56] References Cited

U.S. PATENT DOCUMENTS 4,853,251 8/1989 Ishihara et al. .
5,215,787 6/1993 Homma .
5,266,525 11/1993 Morozumi ........................... 437/195

FOREIGN PATENT DOCUMENTS

64-47053 2/1989 Japan .

Primary Examiner—Olik Chaudhuri
Assistant Examiner—C. Everhart
Attorney, Agent, or Firm—Burns, Doane, Swecker & Mathis

[57] ABSTRACT

A method for forming a multi-level wiring structure for semiconductor devices includes the steps of forming inter-layer insulating films and exposing at least a part of such films to a vapor containing alkoxyfluorosilane. This enables the water content of silicon oxide films to be reduced, the quality thereof to be made higher and the production yield and the reliability of the product to be enhanced. The method for forming an insulating film includes the steps of exposing such film to a vapor containing alkoxyfluorometal as a major component and heat-treating the exposed film. The method for forming a surface protective film includes the steps of forming a silicon oxide film at a temperature of 250° C. at most, applying to such film a coating solution for SOG, heat-treating the film at a temperature of 200° C. at most, exposing the film to a vapor containing alkoxyfluorosilane as a major component, heat-treating at a temperature of 250° C. to form a fluorine-containing silicon oxide film. Then, a silicon nitride film is formed at a temperature not higher than 250° C. At low temperatures not higher than 250° C., the film has a high flatness and no crack develops thereon and no hillock develops on aluminum wirings. All these contribute to the fabrication of highly reliable semiconductor devices.

13 Claims, 12 Drawing Sheets

METHOD FOR FORMING INTERCONNECT STRUCTURE, INSULATING FILMS AND SURFACE PROTECTIVE FILMS OF SEMICONDUCTOR DEVICE

BACKGROUND OF THE INVENTION (1) Field of the Invention

The present invention relates to a method for fabricating a semiconductor device, and more particularly to a method for forming a multi-level wiring structure, a method for forming an insulating film, and a method for forming a surface protective film of a semiconductor device.

(2) Description of the Related Art

Conventional multi-level wiring structures of the type to which the present invention relates are formed, for example, by a method as disclosed in Japanese Patent Application KOKAI (Laid-open) No. Sho 64(1989)-47053. Such conventional method follows the procedure explained hereunder.

Figure 1A:
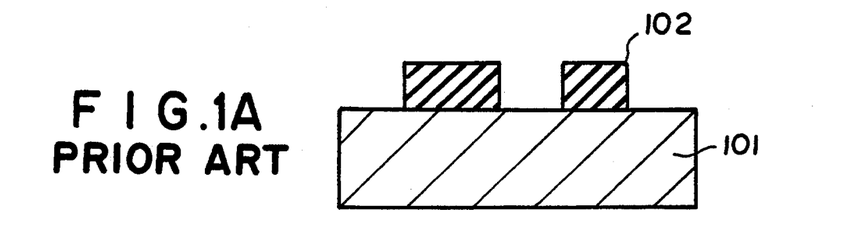
FIGS. 1A through 1G show a series of schematic cross-sectional views representing the steps of the prior art method for forming a two-layer wiring structure.
Figure 1B:
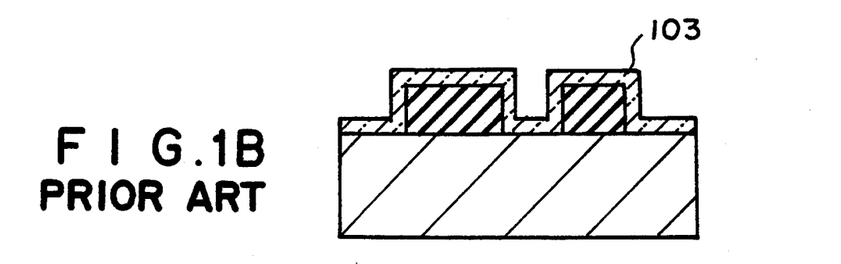
Figure 1C:
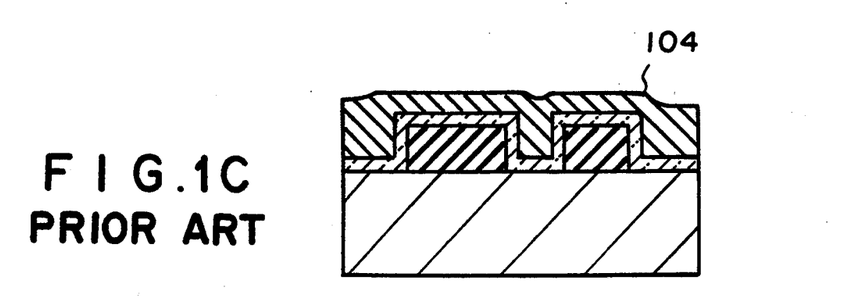
Figure 1D:
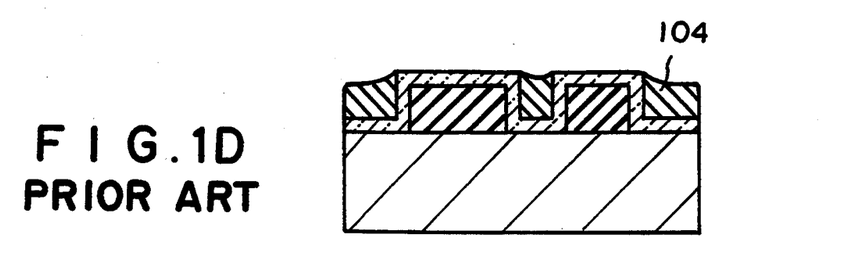
Figure 1E:
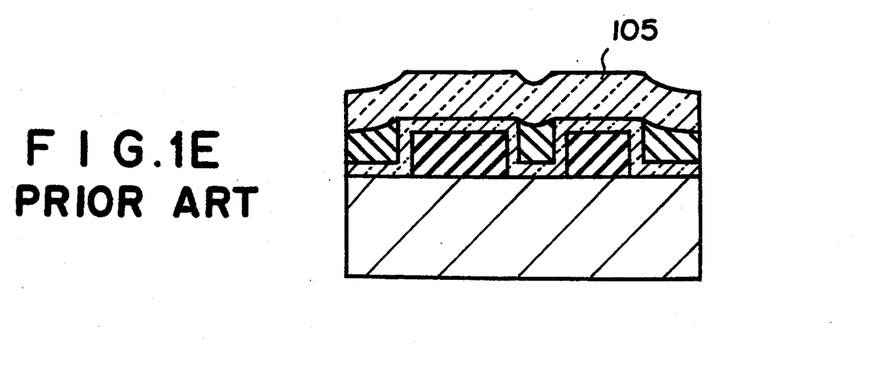
Figure 1F:
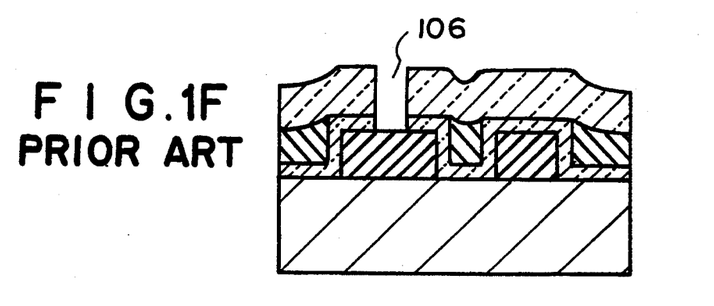
Figure 1G:
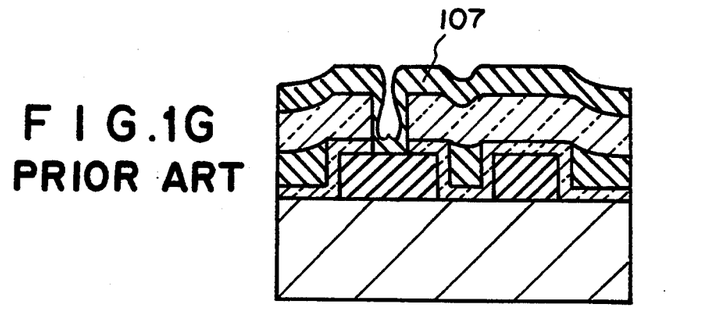

As shown in FIG. 1A, a first level wiring 102 of an Al—Si alloy is formed on a semiconductor substrate 101. Then, as shown in FIG. 1B, a first insulating film 103 of phosphosilicate glass (hereinafter referred to as "PSG") is formed over the entire surface by an atmospheric-pressure CVD (Chemical Vapor Deposition) process to a thickness of about 200 nm. Subsequently a glass solution is applied by spinning at a 5000 rpm, and baked at 150° C. for one minute and at 300° C. for thirty minutes to solidify. This procedure for application of the glass solution by spinning and baking is repeated two or three times to form a glass coating film 104 having a thickness of about 200 nm on the wirings 102 as shown in FIG. 1C. Thereafter, the overall glass coating film 104 is etched in a depth of 200 nm by a reactive ion etching (RIE) method to produce a structure as shown in FIG. 1D. Then, the second insulating film 105 of PSG is formed over the entire surface to a thickness of 400 nm by the atmospheric-pressure CVD process, as shown in FIG. 1E. Subsequently, a hole 106 is formed as shown in FIG. 1F, and then a second level wiring 107 is formed to fabricate a two-level wiring structure as shown in FIG. 1G.

However, the conventional or prior art method for forming the multi-level wiring structure as described above has the following problems. That is, in the overall etching step after the formation of the glass coating film, the glass coating film is apt to be over-etched resulting in a considerable deterioration of the surface flatness because the glass coating film has a higher etching rate than that of the PSG film formed by the CVD process.

Moreover, a profile of the formed glass coating film is largely dependent upon an underlying pattern in a manner that a thicker glass coating film is formed on a wider pattern wiring. The glass coating film on the wider pattern wiring remains even after the glass coating film on a thinner pattern wiring has been etched out. Thereafter, upon the formation of the second level wiring after through-holes have been formed, the water content or the moisture hydroscopically contained in the glass coating film is released to oxidize the bottom of the hole, i.e., the surface of the lower level wiring, which oxidation will adversely affect electrical conduction.

These disadvantages result in markedly lowering the yield of production of semiconductor devices and the reliability.

In the formation of insulating films which is a process preceding the formation of the multi-level wiring structure, generally thermal treatment has been widely used. For example, after a silicon oxide film has been formed on a silicon substrate by a thermal chemical vapor deposition process at a temperature of at least 300° C., it is heat-treated at a temperature of at least 900° C. in order to reduce the water content of the film and to make it dense. Moreover, this heat-treatment simultaneously improves the quality of the insulating films which are used as insulating films for semiconductor devices.

However, the conventional process for the forming of the insulating films as described above has disadvantages as follows. When the films are formed by the thermal chemical vapor deposition process at a temperature of about 300° C., they themselves are of a rough texture and have a high water content, and tend to absorb moisture so that they are unsuitable for ready practical use. Therefore, they require a heat-treatment for densification at a temperature of at least 900° C. The temperature of 900° C. or more is undesirable for the production of semiconductor devices. That is, impurities injected into a device region are redistributed by this heat-treatment to make it impossible to achieve desired device properties. Thus, the resultant devices will not be useful for ULSI such as 64 Mbit DRAM and the like to come in the future.

Figure 2:
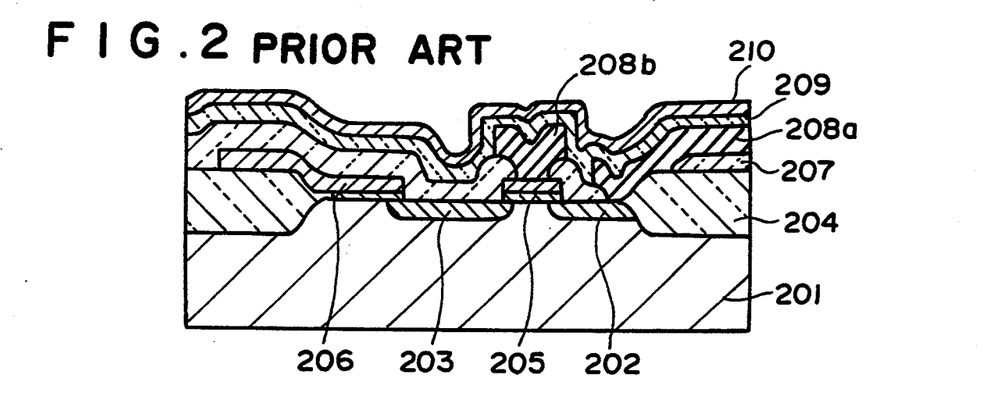
FIG. 2 is a schematic cross-sectional view of a MOS type transistor cell to be used for the explanation of the prior art.

Conventional surface protective films of the type which the present invention concerns are formed by the following process. That is, on a MOS type transistor memory cell having an N+-type source 202, an N+-type drain 203, a field insulating film (SiO$_2$) 204, a polycrystalline silicon (Si) gate 205, a storage capacitor electrode 206 composed of polycrystalline Si, a POS film 207, aluminum electrode wirings 208a and 208b formed on a semiconductor substrate 201 of P-type silicon and the like, as shown in FIG. 2, there is grown a first level silicon oxide film 209 having a thickness of about 100 nm by a plasma-assisted or enhanced CVD process with monosilane (SiH$_4$) and nitrogen monoxide (N$_2$O) at a temperature of about 300° to 400° C. Then, a second level silicon nitride film 210 having a thickness of about 500 nm by the plasma-enhanced CVD process with monosilane (SiH$_4$) and ammonia (NH$_3$) at a temperature of about 300° to 400° C.

Figure 3:
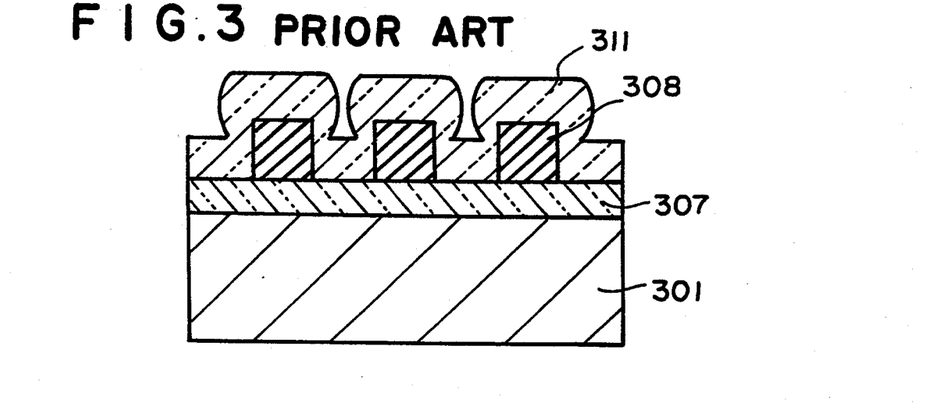
FIG. 3 is a schematic cross-sectional view of a semiconductor chip to be used for the explanation of the prior art.

The prior art method for forming the surface protective films has the following problems. That is, in a region where a plurality of aluminum electrode wirings 308 are disposed closely to one another as diagrammatically shown in FIG. 3, as the aluminum electrode wirings have been required to be made thinner, a protective film 311 (which refers to the silicon oxide film 209 and the silicon nitride film 210 as a whole, which are shown in FIG. 2) formed by the CVD process has inevitably overhangs as shown in FIG. 3 owing to a rigorous irregularity of the surface of the substrate having the aluminum wirings before the protective film 311 is formed by the CVD process. Therefore, when the semiconductor chip is sealed with resin, a thermal stress imposed by the sealing resin may cause breakdown of the aluminum electrode wirings and cracking of the protective film.

Moreover, the formation of the protective film over the aluminum electrode wirings at a temperature not less than 300° C. causes development of hillocks on the surfaces of the aluminum electrode wirings resulting in a lower yield of semiconductor devices to be produced and a great reduction in reliability.

In addition, when the semiconductor devices are continuously operated in a high temperature environment, the thermal stress imposed on the protective film accelerates the breakdown of the aluminum electrode wirings, or corrosion of the aluminum electrode wirings occurs due to the ingress of moisture into the cracks produced in the protective films with a great reduction in reliability, rendering the semiconductor devices to be of no practical use.

SUMMARY OF THE INVENTION

An object of the invention is to overcome the problems existing in conventional methods for forming a multi-level wiring structure, for forming an insulating film and for forming a surface protective film on a semiconductor device and to provide improved methods therefor.

According to one aspect of the invention, there is provided a method for forming a multi-level wiring structure for use in semiconductor devices comprising the steps of: forming interlayer insulating films; and exposing at least a part of the interlayer insulating films to a vapor containing alkoxyfluorosilane ($F_n$—Si(OR)$_{4-n}$, where R is an alkyl radical, and n is an integer of 1 to 3) as a major component.

In preferred embodiments, the process of the exposure to the vapor containing alkoxyfluorosilane is carried out after at least one of the processes of forming at least a part of the interlayer insulating films, forming a hole for electrically connecting an upper level wiring and a lower level wiring, and forming a hole for electrically connecting wirings with diffusion layers in a semiconductor substrate. The interlayer insulating films are preferably composed of silicon dioxide as a major component.

According to another aspect of the invention, there is provided a method for forming an insulating film of a semiconductor device comprising the steps of: forming an insulating film on a semiconductor substrate; exposing the insulating film to a vapor containing alkoxyfluorometal as a major component; and heat-treating the exposed film.

In preferred embodiments, the insulating film is formed by at least one of the processes covering chemical vapor deposition process, sputtering process, vacuum evaporation process, coating process, immersion process, and thermal oxidation process. The insulating film is a film containing as a major component at least one selected from the group consisting of silicon oxide, aluminum oxide, titanium oxide, tantalum oxide, hafnium oxide and zirconium oxide.

Preferably the alkoxyfluorometal is at least one selected from the group consisting of alkoxyfluorosilane represented by the general chemical formula, $F_n$—Si(OR)$_{4-n}$, where R is an alkyl radical, and n is an integer of 1 to 3; alkoxyfluorotantalum represented by the general chemical formula, $F_n$—Ta(OR)$_{5-n}$, where R is an alkyl radical, and n is an integer of 1 to 4; alkoxyfluorozirconium represented by the general chemical formula, $F_n$—Zr(OR)$_{4-n}$, where R is an alkyl radical, and n is an integer of 1 to 3; alkoxyfluorotitanium represented by the general chemical formula, $F_n$—Ti(OR)$_{4-n}$, where R is an alkyl radical, and n is an integer of 1 to 3; alkoxyfluorohafnium represented by the general chemical formula, $F_n$—Hf(OR)$_{4-n}$, where R is an alkyl radical, and n is an integer of 1 to 3; or alkoxyfluoroaluminum represented by the general chemical formula, $F_n$—Al(OR)$_{3-n}$, where R is an alkyl radical, and n is an integer of 1 or 2.

According to a further aspect of the invention, there is provided a method for forming a surface protective film on a semiconductor device comprising the steps of: forming a first silicon oxide film on a semiconductor chip having an uppermost level wiring at a temperature of 250° C. at most; applying to the silicon oxide film a coating solution for SOG (spin on glass) which is an alcohol solution prepared with at least one selected from the group consisting of compounds represented by the general chemical formula, Si(OH)$_4$, Si(OR)$_4$, or $R_n$—Si(OR)$_{4-n}$ where R is an alkyl radical, and n is an integer of 1 to 3; heat-treating the film at a temperature of 200° C. at most to dry; exposing the film to a vapor containing as a major component alkoxyfluorosilane represented by the general chemical formula $F_m$—Si(OR)$_{4-m}$, where R is an alkyl radical and m is an integer of 1 to 3; heat-treating the film at a temperature of 250° C. at most to form a silicon oxide based glass film; and forming an insulating film at a temperature of 250° C. at most by a plasma-enhanced chemical vapor deposition process.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, some preferred embodiments will be explained with reference to the accompanying drawings.

First Embodiment

The method for fabricating a multi-level wiring structure of the present invention will be described with reference to drawings. FIGS. 4A through 4G show a series of schematic cross-sectional views representing the steps of an embodiment of the method for forming a two-level aluminum wiring structure according to the present invention.

Figure 4A:
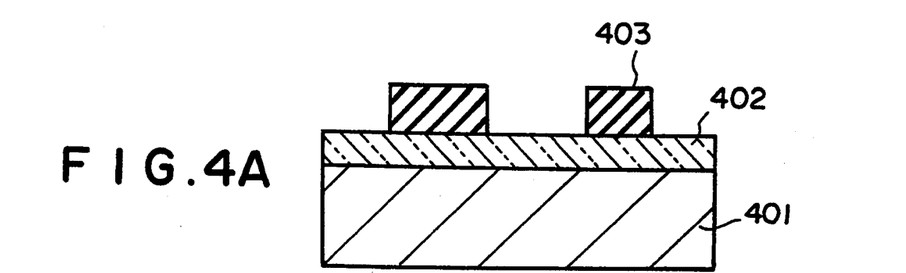
FIGS. 4A through 4G show a series of schematic cross-sectional views representing the steps of a first embodiment of the method for forming a two-layer aluminum wiring structure according to the present invention.
Figure 4B:
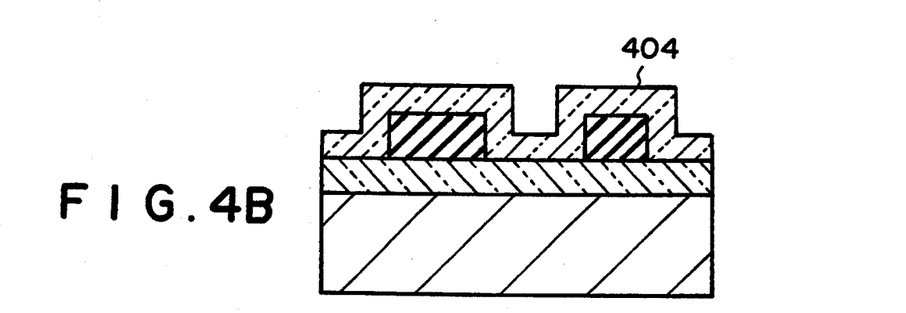
Figure 4C:
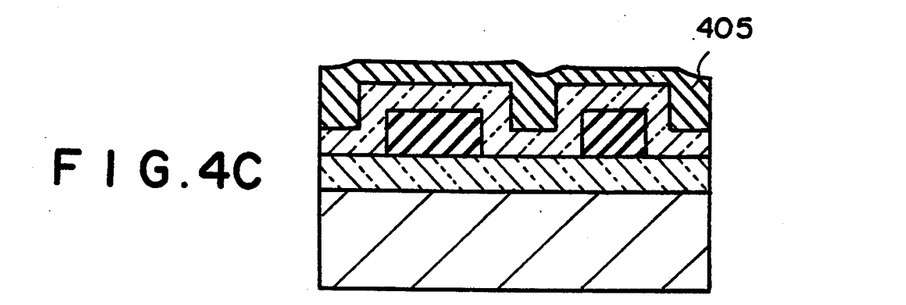

A first aluminum wirings 403 was formed on an insulating film 402 which has been provided on a semiconductor substrate 401 as shown in FIG. 4A, and thereafter a first silicon oxide film 404 having a thickness of about 0.4 μm is formed by the plasma-enhanced chemical vapor deposition process as shown in FIG. 4B. Then, an alcohol solution prepared to have a silanol solid concentration of 8% by weight was applied onto the silicon oxide film by spin coating at 4000 revolutions/minute (rpm) for 20 seconds and baked on a hot-plate kept at 100° C. for one minute, followed by annealing in an electric furnace kept at a temperature of 400° C. in an atmosphere of $N_2$. This cycle of applying, baking and annealing was repeated three times to produce a glass coating film 405 having a thickness of about 0.2 μm on the wirings 403 with the underlying recesses being almost completely filled, as shown in FIG. 4C.

Figure 4D:
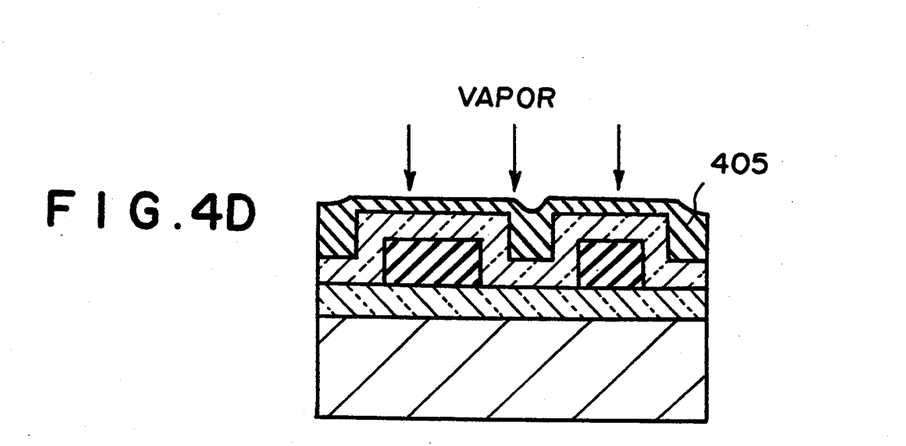
Figure 4E:
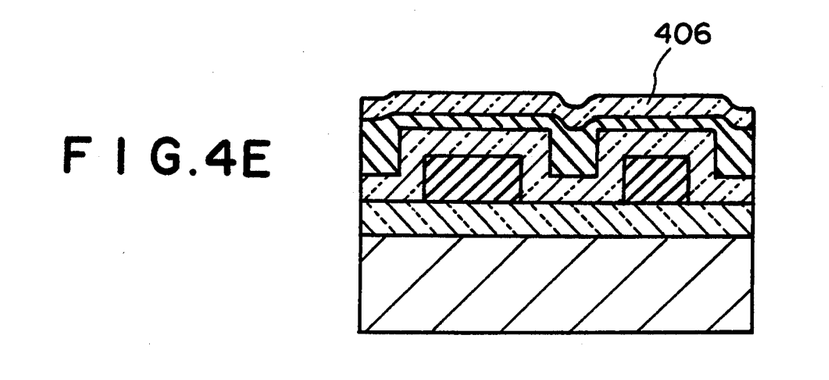
Figure 4F:
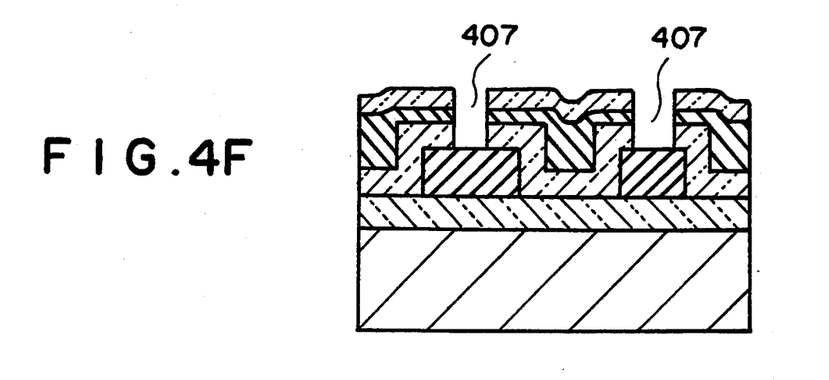
Figure 4G:
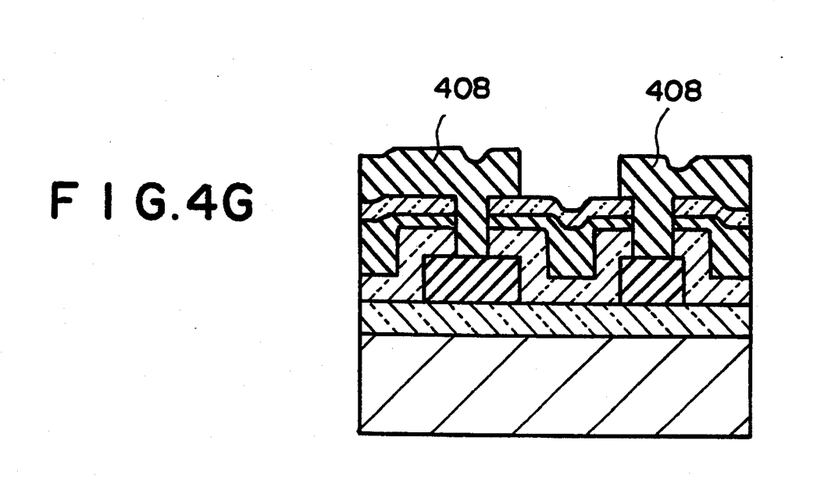

Then, a solution containing as a major component triethoxyfluorosilane represented by the general chemical formula, $F-Si(OC_2H_5)_3$ was placed in a polytetrafluoroethylene vessel which was maintained at a room temperature (25° C.). The glass coating film was exposed to the vapor of triethoxyfluorosilane for 60 minutes without allowing the semiconductor substrate to contact directly with the solution, as shown in FIG. 4D. Subsequently, the second silicon oxide film 406 having a thickness of about 0.4 μm was formed by the plasma-enhanced chemical vapor deposition process, as shown in FIG. 4E. Thereafter, holes 407 were formed at predetermined positions by a known photo-etching technique, as shown in FIG. 4F, and then second aluminum wirings 408 were formed, as shown in FIG. 4G. By the steps as described above, the two-level aluminum wiring structure was formed.

In the two-level aluminum wiring structure formed by the aforementioned steps, the surface of the interlayer insulating film was almost completely flattened so that the second aluminum wirings did not cause any short or any breakdown thereof. The holes of a diameter of 1 μm had a contact resistance of about 120 mΩ (including the wiring resistance) per hole which was smaller than that (about 150 mΩ) of the holes having a diameter of 1 μm produced by the prior art. Moreover, the yield of the holes was 98% or more which was higher than that (85%) in the prior art.

Figure 5:
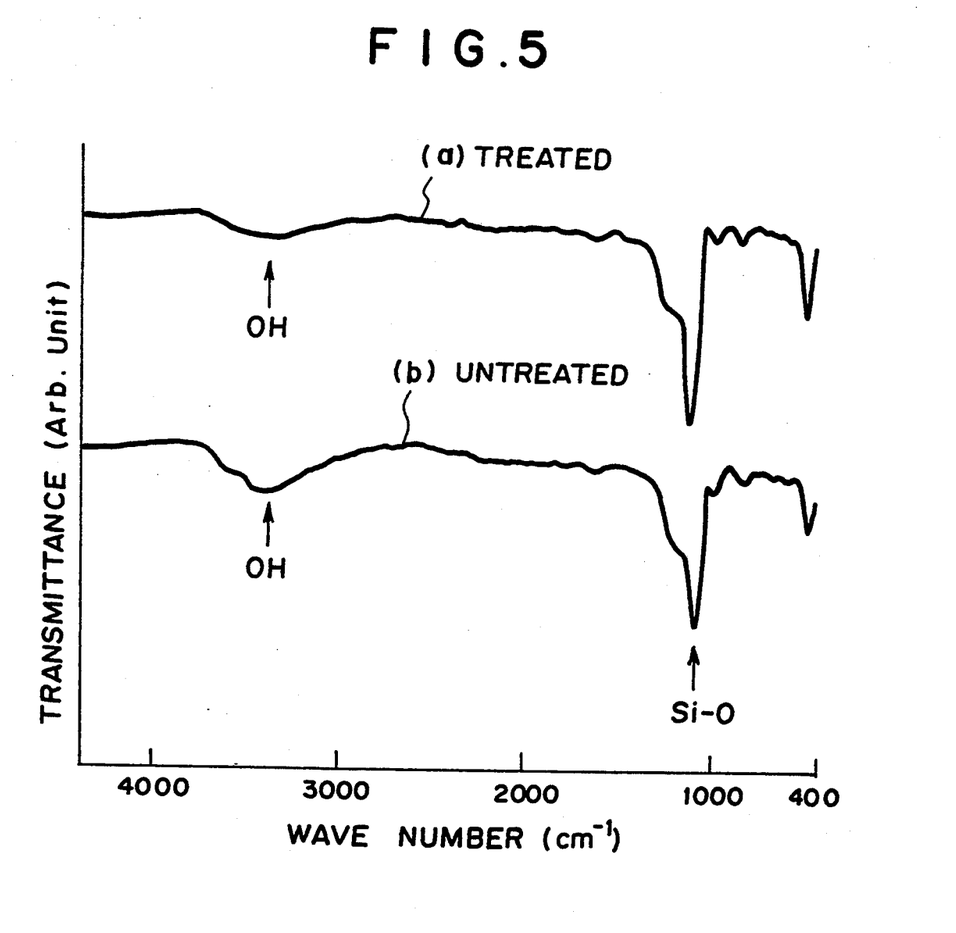
FIG. 5 is a chart showing the FT-IR spectra of a glass coating film to be used for the explanation of the effects of the first embodiment of the present invention.

This example achieved a high yield of open holes for the reasons as follows. That is, as can be seen from the FT-IR spectrum curves (a) and (b) in FIG. 5, the process of exposing the glass coating film to the vapor of triethoxyfluorosilane as effected in this example reduced the peak absorption at a wave number of about 3400 $cm^{-1}$ owing to an OH radical as compared to that of an untreated glass coating film. This indicates that the water content in the glass coating film was lowered, with a result that the lower level wirings exposed on the bottom of the holes are less susceptible to oxidation. In contrast, the peak absorption in the vicinity of a wave number of about 1080 $cm^{-1}$ owing to Si—O bond was enlarged and made sharp. This indicates that the silicon oxide film came to have a higher quality.

Although this example employed aluminum (Al) as wiring material, other materials such as at least one selected from the group consisting of aluminum alloys, refractory metals, and noble metals may be employed. The silicon oxide film for use in a part of the interlayer insulating film produced by the plasma-enhanced chemical vapor deposition process may be replaced by a silicon oxide film produced by sputtering, chemical vapor deposition, vacuum evaporation, or immersion process, or a combination thereof.

Triethoxyfluorosilane used in this example may be replaced by other alkoxyfluorosilane. Moreover, at least one of the steps of exposing to the vapor of triethoxyfluorosilane may be performed after at least one of the steps of forming a part of the interlayer insulating film or forming the holes.

The present invention can be applied to any one of the two-, or higher level wiring structures, though the two-level aluminum wiring structure was formed in this example.

As described above, the present invention has advantages that it enables an interlayer insulating film having an excellent flatness to be formed and facilitates stratifying wirings because no etching of the overall surface of the glass coating film is required.

Moreover, the exposure of the interlayer insulating film, especially the glass film, to the vapor of alkoxyfluorosilane according to the present invention has effects that high quality silicon oxide films can be produced at lower temperatures, the water content of the glass coating film can be greatly reduced, and that an increase in contact resistance at the holes or a failure of electrical communication can be completely avoided, thereby greatly enhancing the yield of the products and the reliability thereof.

Second Embodiment

A method for forming the insulating film of the present invention will be explained with reference to drawings. For this embodiment, the explanation is directed to an application of the method to a silicon oxide film produced by a coating process with an alcohol solution containing as a major component silanol represented by the general chemical formula $Si(OH)_4$.

Figure 6:
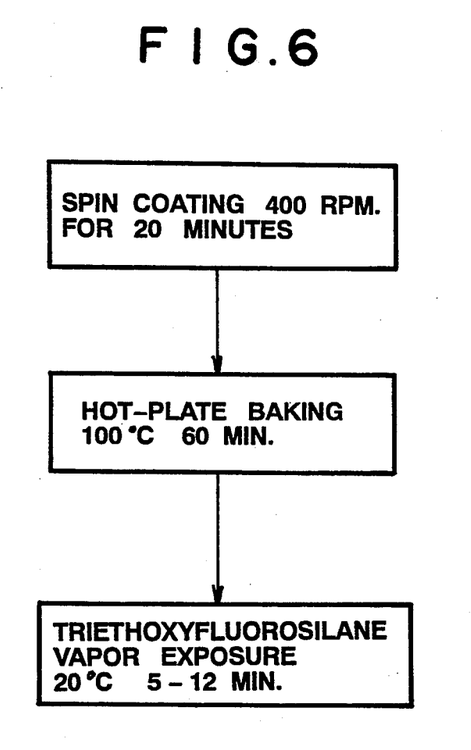
FIG. 6 is a flow sheet diagram of a second embodiment of the present invention.
Figure 7:
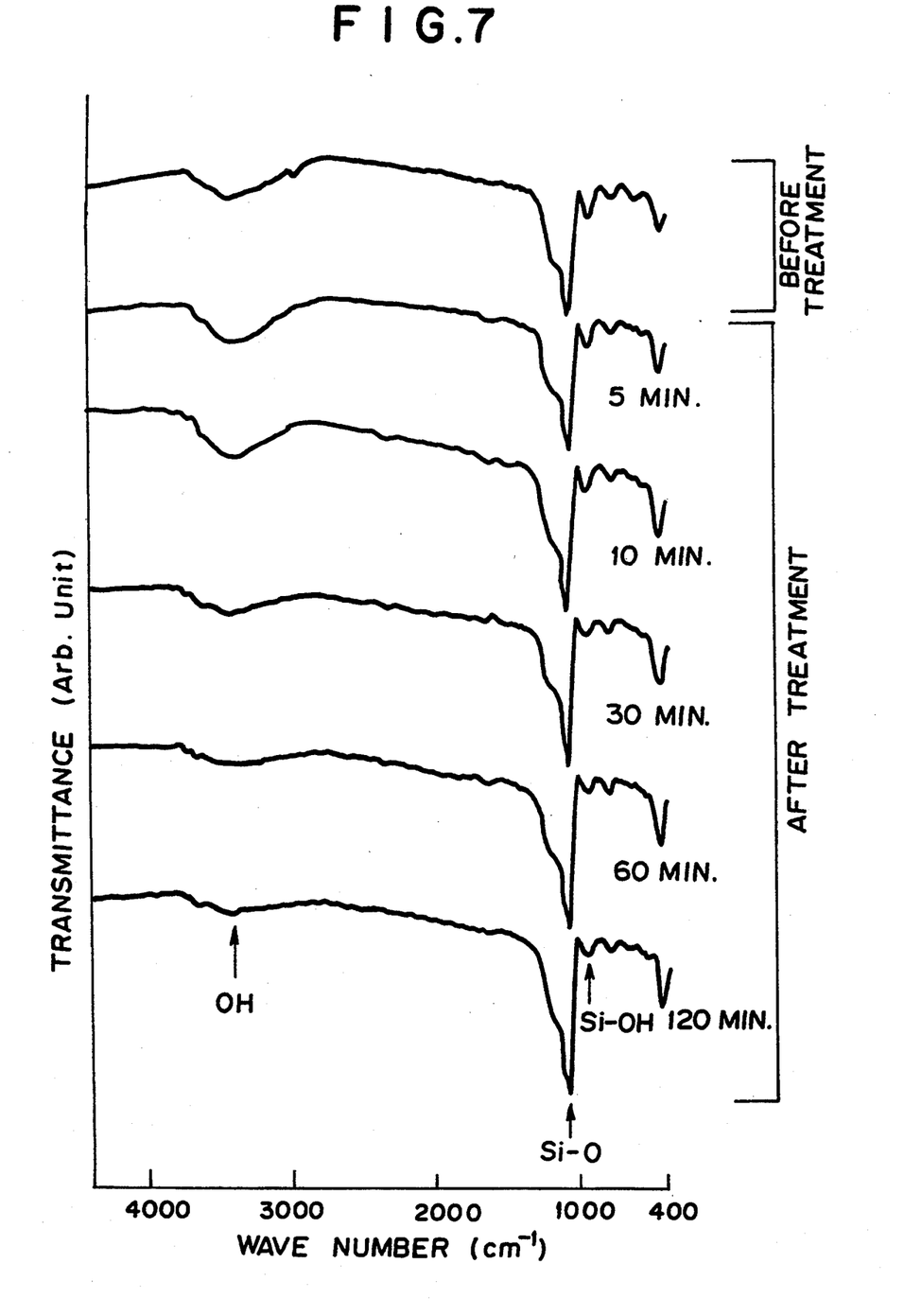
FIG. 7 is a chart showing the varying FT-IR spectra representing the effects of one mode of the second embodiment of the present invention.

FIG. 6 is a flow sheet diagram of the method for forming the insulating film according to the present invention. A solution of silanol in ethyl alcohol solvent having a concentration of 10% by weight was applied onto a P-type silicon substrate by spin coating at a revolution rate of 4000 rpm, and baked on a hot-plate kept at 100° C. for 60 seconds to form a silicon oxide film having a thickness of about 0.2 μm which film was used as a sample. Then, a solution of triethoxyfluorosilane represented by the general chemical formula, $F-Si(OC_2H_5)_3$ was placed in a polytetrafluoroethylene vessel which is maintained at the room temperature (25° C.). The insulating film was exposed to the vapor of triethoxyfluorosilane for 5 to 120 minutes without allowing the semiconductor substrate to contact directly with the solution. The film was measured for infrared absorption spectrum before and after the treatment for comparison. FIG. 7 shows FT-IR spectra of the film before and after the exposure to the vapor for 5, 10, 30, 60, 120 minutes. In the Figure, there can be noted a peak absorption in the vicinity of a wave number of about 1070 cm$^{-1}$ owing to a Si—O bond and a peak absorption in the vicinity of a wave number of about 950 cm$^{-1}$ owing to a Si—OH bond. For the exposure treatment in this example, the longer the treatment time, the lower the peak absorption owing to the Si—OH bond. This means that the water content of the film was reduced by the treatment according to this embodiment. Moreover, the peak intensity of absorption owing to the Si—O bond was increased and sharpened with the time by the treatment in this example. This indicates that the exposure treatment according to this embodiment allows the Si—O bond to be stronger and the density thereof to be increased.

Figure 8:
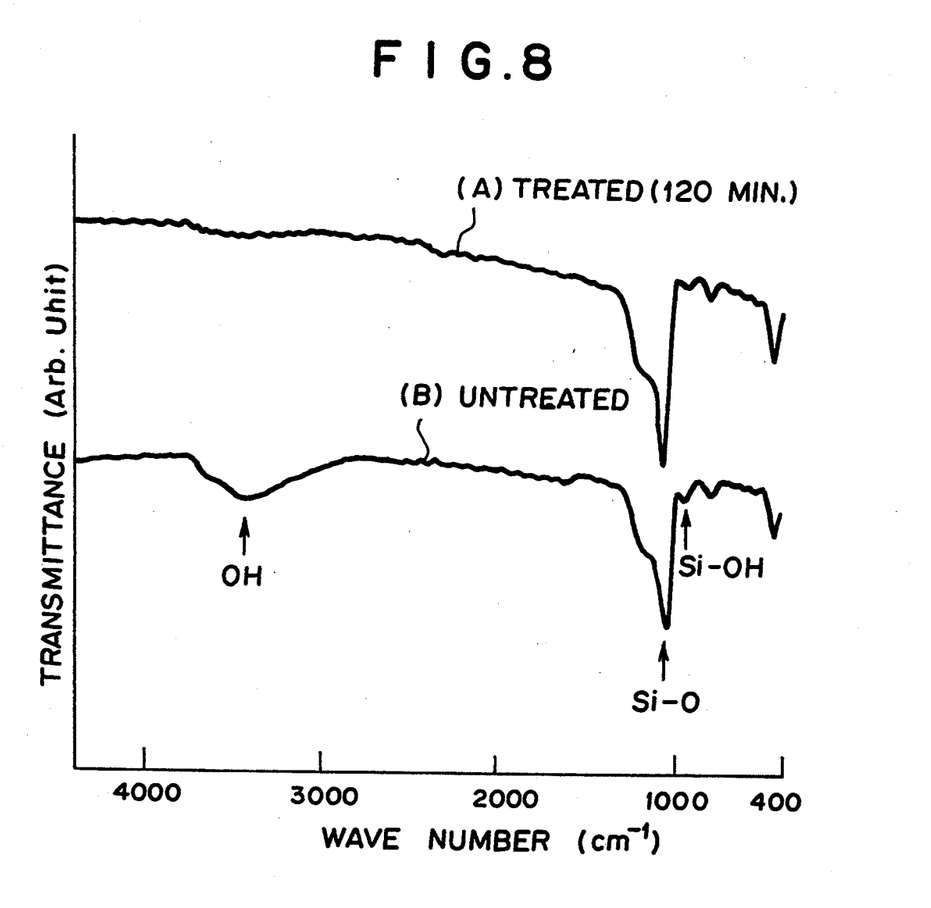
FIG. 8 is a chart showing the varying FT-IR spectra representing the effects of another mode of the second embodiment of the present invention.

FIG. 8A shows the FT-IR spectrum of the film after the exposure treatment at the room temperature for 120 minutes according to this embodiment, followed by heat-treating in an electric furnace at a temperature of 400° C. in an atmosphere of $N_2$ for 30 minutes. For comparison, FIG. 8B shows the FT-IR spectrum of the film subjected to the same heat-treatment but without effecting the above exposure treatment. It can be seen from the chart that the peak absorption in the vicinity of a wave number of about 3400 cm$^{-1}$ owing to the OH radical was almost completely disappeared by performing the exposure treatment according to this embodiment, followed by the heat-treatment at 400° C. This indicates that the water content remaining in the film was almost completely removed.

The silicon oxide films having a thickness of about 0.2 μm were formed by being subjected to the exposure treatment according to this embodiment at the room temperature for 120 minutes, then to the heat-treatment with $N_2$ at 400° C. On the films there were provided with aluminum electrodes having an area of 1 mm$^2$ formed thereon to measure the films for leakage current. The leakage current density at an applied voltage of 5 V was about $5 \times 10^{-9}$ A/cm$^2$ for the films subjected to the exposure treatment according to this embodiment, which was smaller by two orders of magnitude as compared to a leakage current density of about $5 \times 10^{-7}$ A/cm$^2$ for the untreated films.

The exposure treatment according to this embodiment was performed after the baking on the hot-plate at 100° C. in this example. Alternatively, the baking may be conducted by any techniques other than by use of the hot-plate, and the temperature may be optionally selected.

In order to increase the vapor pressure of alkoxyfluorometal, heating may be used. Furthermore, bubbling may be used to enhance the effects.

Although, in this example, the insulating films were formed by the coating technique with a solution whose major component is silanol, other techniques may be employed such as at least one of chemical vapor deposition, sputtering, vacuum evaporation, immersing, and thermal oxidation techniques. The insulating film materials to be applied other than silicon oxide include metal oxides such as aluminum oxide, titanium oxide, tantalum oxide, hafnium oxide, and zirconium oxide.

The triethoxyfluorosilane used in this example may be replaced by other alkoxyfluorosilane.

When other metal oxide films are to be treated. an alkoxyfluorometal constituted by the same sort of metal should preferably be used.

As described above, the present invention has the effects that it enables a great reduction in the water content of the insulating films, a densification of the films, and the production of higher quality films at lower temperatures by exposing the films to the vapor of alkoxyfluorometal. Moreover, the treatment with fluorinated compounds can impart hydrophobic property to the films allowing a remarkable reduction in water absorption thereinto. The present invention has also an effect of allowing formation of the films exhibiting a less leakage current at lower temperatures. From the foregoing, the present invention can be used to greatly lower the treatment temperature in the production of semiconductor devices and at the same time can achieve effects of enhancing the yield of semiconductor devices and improving remarkably the reliability thereof.

Third Embodiment

A method for forming the surface protective films of the present invention will be described with reference to the drawings.

FIGS. 9A through 9D are schematic cross-sectional views to be used for explanation of the sequential steps for forming a surface protective film according to the present invention.

Figure 9A:
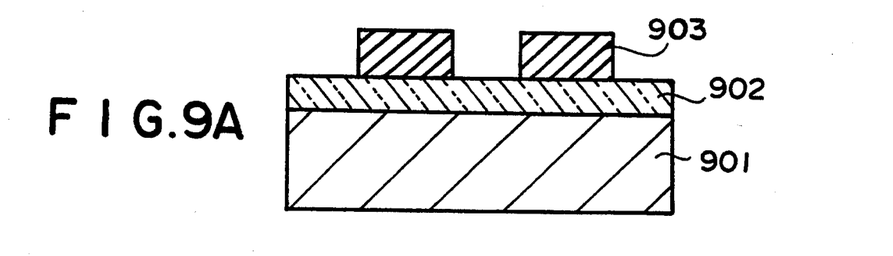
FIGS. 9A through 9D show a series of schematic cross-sectional views representing the steps of a third embodiment of the present invention.
Figure 9B:
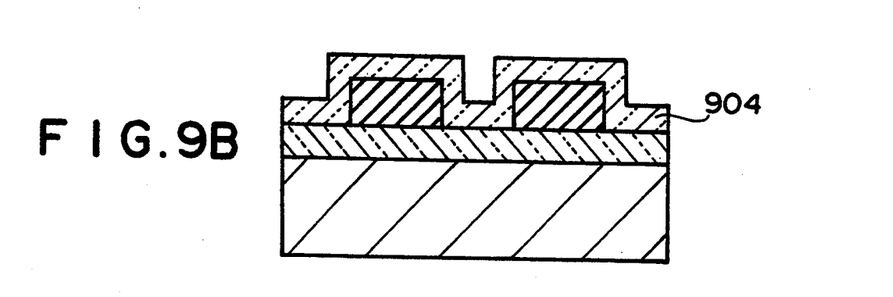
Figure 9C:
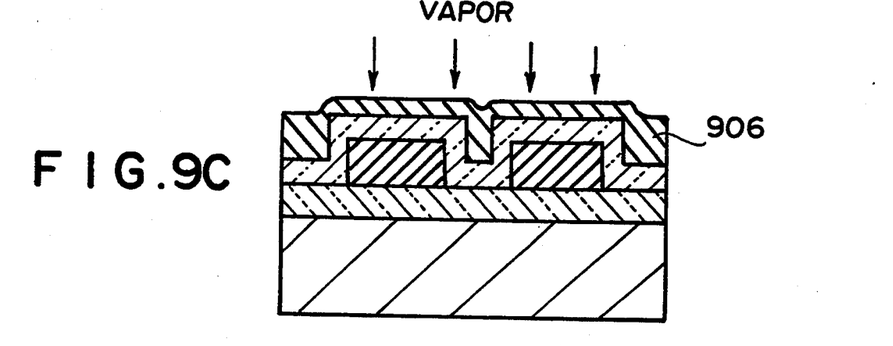

As shown in FIG. 9A, a PSG film 902 of about 0.8 μm in thickness is formed on a semiconductor substrate 901 which is provided with elements such as transistors and the like (not shown). On such semiconductor chip, there are formed aluminum wirings 903 having a thickness of about 0.8 μm. Then, a silicon oxide film 904 having a thickness of 0.4 μm is formed by the plasma-enhanced chemical vapor deposition process at a temperature of 250° C. as shown in FIG. 9B. An ethyl alcohol solution containing 10% by weight Si(OH)$_4$ is applied onto the silicon oxide film by spin coating at a revolution rate of 4000 rpm, and then baked on a hot-plate kept at a temperature of 100° C. for 60 seconds to form a coating film. The film is exposed to the vapor of triethoxyfluorosilane represented by the general chemical formula, F—Si(OC$_2$H$_5$)$_3$ at the atmospheric pressure at the room temperature (25° C.) for 30 minutes, followed by heat-treating at a temperature of 250° C. for 60 minutes to form a fluorine-containing silicon oxide film 906 having a thickness of about 0.4 μm as shown in FIG. 9C.

Figure 10:
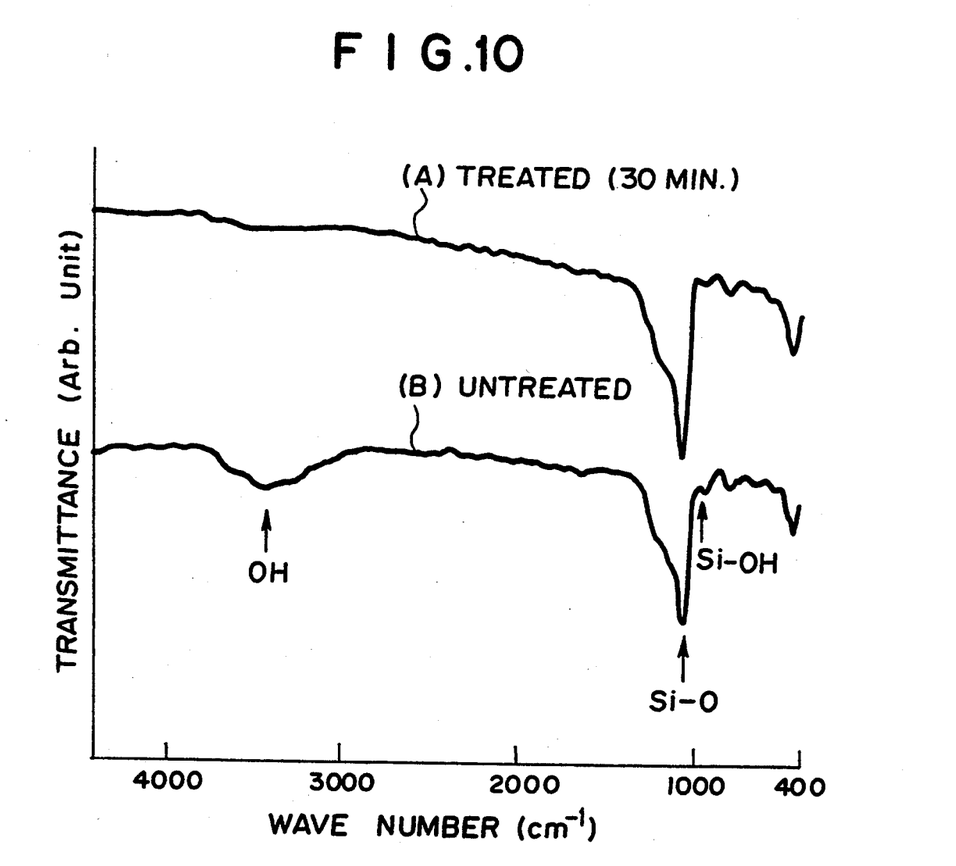
FIG. 10 is a chart showing the characteristic FT-IR spectra to be used for the explanation of one mode of the third embodiment of the present invention.

The fluorine-containing silicon oxide film 906 thus formed was analyzed from FT-IR spectrum, the results of which are shown as a curve A in FIG. 10. The spectrum of the SOG film not subjected to the treatment with the vapor of triethoxyfluorosilane is shown as a curve B. It can be appreciated that the peak absorption in the vicinity of a wave number of about 3400 cm$^{-1}$ owing to the OH radical disappeared almost completely, thereby achieving a high quality silicon oxide insulating film having a lower water content.

Figure 9D:
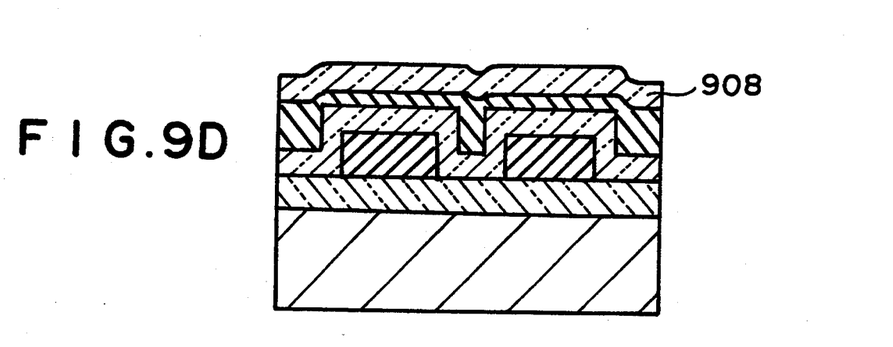

Thereafter, a silicon nitride film 908 having a thickness of about 0.5 μm by the plasma-enhanced chemical vapor deposition process at a temperature of 250° C. as shown in FIG. 9D. Finally a known photo-etching technique was used to form holes on an aluminum pad (not shown).

The surface protective films produced by the method as described above exhibited no cracking and a sufficiently flat surface.

The surface protective films produced by the method as described above were evaluated for reliability by subjecting to a test for insusceptibility to moisture which was conducted under a saturated vapor pressure of 2.1 atom at a temperature of 125° C. with the films being incorporated in a package of a resin sealed type, and also being subjected to a temperature cycling test in the range of 125° C. to 25° C. to −65° C. As a result, no failure occurred even after 500 hours, and after 300 cycles, respectively.

Moreover, there was no hillock, because the films was not processed through any temperature above 250° C. after the formation of the aluminum electrode wirings.

In the foregoing, the example where the coating solution for the SOG using $Si(OH)_4$ and triethoxyfluorosilane were employed was described.

Figure 11:
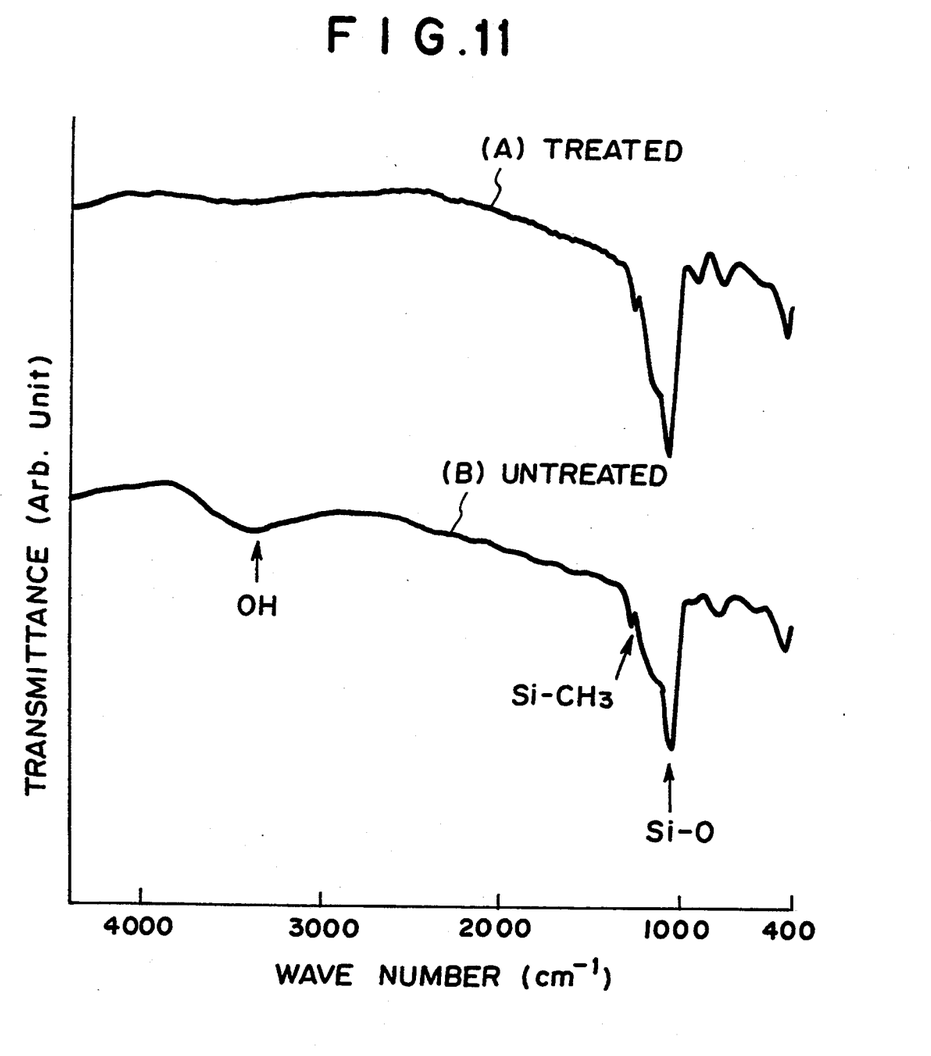
FIG. 11 is a chart showing the characteristic FT-IR spectra to be used for the explanation of another mode of the third embodiment of the present invention.

Other coating solutions for the SOG include alkoxysilane compounds such as $Si(OR)_4$, where R is an alkyl radical, and $R_n$—$Si(OR)_{4-n}$, where R is an alkyl radical and n is 1, 2, or 3, which may be used with almost the same results. FIG. 11 shows an FT-IR spectrum of the film in which $CH_3$—$Si(OC_2H_5)_3$ is used and which is exposed to the vapor of triethoxyfluorosilane at 25° C. for 30 minutes and then is subjected to the heat-treatment at 250° C. for 30 minutes (curve A) is compared to that of the identical film subjected to the heat-treatment but without exposing to the vapor of triethoxyfluorosilane (curve B). Again it can be noted that a high quality silicon oxide insulating film having a lower water content could be attained.

Figure 12:
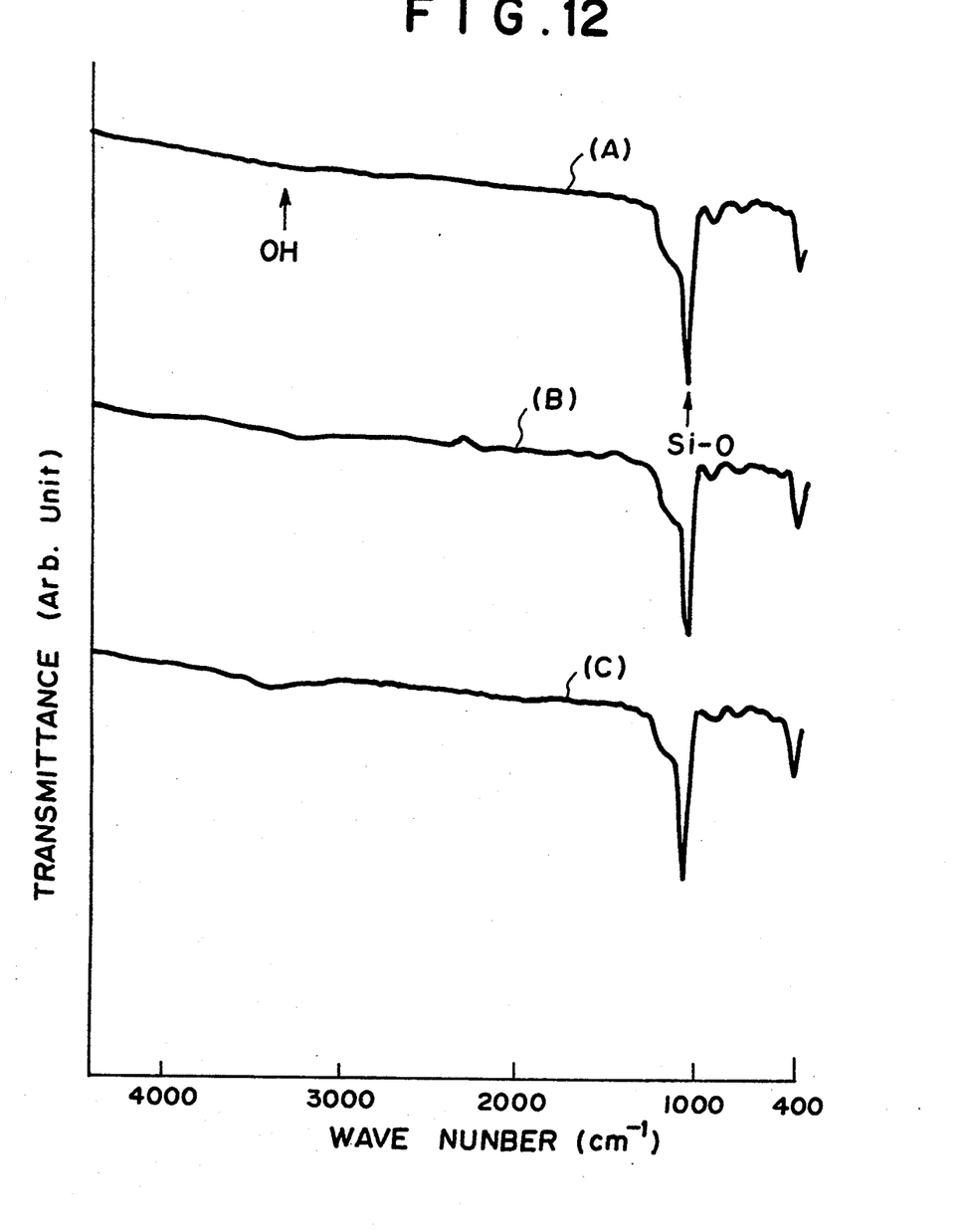
FIG. 12 is a chart showing the characteristic FT-IR spectra to be used for the explanation of still another mode of the third embodiment of the present invention.

FIG. 12 shows FT-IR spectra of the films produced using other alkoxyfluorosilanes. Curves A, B, and C are the FT-IR spectra of the films using trimethoxyfluorosilane (F—$Si(OCH_3)_3$), trinormalpropoxyfluorosilane (F—$Si(n$-$OC_3H_7)_3$), and tri-isopropoxyfluorosilane (F—$Si(i$-$OC_3H_7)_3$), respectively. These were obtained under the identical conditions to those of the aforementioned example, except that the sort of alkoxyfluorosilane was changed. Generally, F—$Si(OR)_3$, $F_2$—$Si(OR)_2$, and $F_3$—$Si(OR)$ may be used.

That is, the coating solution for the SOG as described above was applied, dried, and exposed to the vapor of alkoxyfluorosilane at the room temperature, whereby a condensation reaction occurred to form a silicon oxide based glass film containing in part fluorine. Therefore, it is unnecessary to conduct such a heat-treatment at high temperatures above 250° C. as required in the formation of the prior art SOG films.

The thicknesses of the insulating films, wiring materials, and the film forming conditions referred to in the above description can be optionally selected. Moreover, on the surface protective film formed according to the present invention, there may be formed a film of resin such as polyimide and the like.

As described above, according to the present invention, the silicon oxide based glass film is formed by applying the coating solution for formation of the SOG films, drying, then exposing to the vapor of triethoxyfluorosilane, and heat-treating at a temperature of 250° C. or less, so that the SOG film thereof can be formed at lower temperatures and simultaneously the surface is flattened resulting in avoidance of the cracking in the protective film and of the breakdown of the aluminum electrode wirings.

In addition, since the protective film is formed at a temperature of 250° C. or less after the aluminum electrode wirings have been formed, no hillock is produced on the aluminum electrode wirings allowing the production yield to be enhanced and the semiconductor devices having a higher reliability to be produced.

There is still another effect that good surface protective films capable of avoiding any cracking or any breakdown of the aluminum electrode wirings which may otherwise occur owing to the thermal stress imposed by the sealing resins can be conveniently obtained at a temperature of 250° C. or less.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method for forming a multi-level wiring structure for use in semiconductor devices comprising the steps of:
    forming interlayer insulating films; and
    exposing at least a part of said interlayer insulating films to an alkoxyfluorosilane vapor.

2. A method for forming a multi-level wiring structure for use in semiconductor devices according to claim 1, wherein said step of forming said interlayer insulating films is performed by forming said interlayer insulating films in multi-level relation, said step includes a process of exposing at least one of said interlayer insulating films after the formation thereof to said alkoxyfluorosilane vapor in the course of said step of forming said interlayer insulating films.

3. A method for forming a multi-level wiring structure for use in semiconductor devices according to claim 1, in which said multi-level wiring structure is composed of an upper level wiring and a lower level wiring, said method includes a process of exposing to said alkoxyfluorosilane vapor after the step of forming a hole reaching said lower level wiring in said interlayer insulating film, said hole being used for connection of said upper level wiring with said lower level wiring.

4. A method for forming a multi-level wiring structure for use in semiconductor devices according to claim 1, in which said multi-level wiring structure is composed of an upper level wiring and a lower level wiring, said method includes a process of exposing to said alkoxyfluorosilane vapor after the step of forming a hole reaching a diffusion layer provided on a semiconductor substrate in said interlayer insulating film, said hole being used for connection of the wirings of said multi-level wiring substrate with said diffusion layer.

5. A method for forming a multi-level wiring structure for use in semiconductor devices according to claim 1, in which said interlayer insulating films are composed of silicon dioxide as a major component.

6. A method for forming an insulating film of a semiconductor device comprising the steps of:
    forming an insulating film on a semiconductor substrate;
    exposing said insulating film to an alkoxyfluorometal vapor; and
    heat-treating said exposed film.

7. A method for forming an insulating film of a semiconductor device according to claim 6, in which said insulating film is formed by at least one process selected from the group consisting of chemical vapor deposition process, sputtering process, vacuum evaporation process, coating process, immersion process, and thermal oxidation process.

8. A method for forming an insulating film of a semiconductor device according to claim 6, in which said insulating film is a film containing as a major component at least one selected from the group consisting of silicon oxide, aluminum oxide, titanium oxide, tantalum oxide, hafnium oxide, and zirconium oxide.

9. A method for forming an insulating film of a semiconductor device according to claim 6, in which said insulating film is an organic film containing at least one selected from the group consisting of silicon oxide, aluminum oxide, titanium oxide, tantalum oxide, hafnium oxide, and zirconium oxide.

10. A method for treating an insulating film of a semiconductor device according to claim 6, in which said alkoxyfluorometal is at least one selected from the group consisting of alkoxyfluorosilane, alkoxyfluorotantalum, alkoxyfluorozirconium, alkoxyfluorotitanium, alkoxyfluorohafnium, and alkoxyfluoroaluminum.

11. A method for forming a surface protective film on a semiconductor device comprising the steps of:
   forming a first silicon oxide film on a semiconductor chip having an uppermost level wiring at a temperature of 250° C. at most;
   applying to said silicon oxide film a coating solution for SOG which is a precursor solution with an alcohol as a solvent, where said precursor is formed by hydrolysis reaction between pure water and tetraalkoxysilane (A),
   $Si(OR)_4$ (A) and/or, alkylalkoxysilane (B),
   $R_n Si(OR)_{4-n}$ (B)
   where R is an alkyl radical, and n is an integer of 1 to 3;
   heat-treating said film at a temperature of 200° C. at most to dry;
   exposing said film to an alkoxyfluorosilane vapor represented by the general chemical formula $F_m$—$Si(OR)_{4-m}$ where R is an alkyl radical and m is an integer of 1 to 3;
   heat-treating said film at a temperature of 250° C. at most to form a silicon oxide based glass film; and
   forming an insulating film at a temperature of 250° C. at most by a plasma-enhanced chemical vapor deposition process.

12. A method for forming a surface protective film on a semiconductor device according to claim 11, in which said alkoxyfluorosilane is triethoxyfluorosilane.

13. A method for forming a multi-level wiring structure on a semiconductor substrate as in claim 1, comprising the steps of:
   forming a lower level wiring;
   forming an insulating film, which is composed of silicon dioxide as a major component, on said lower level wiring by at least one process selected from the group consisting of chemical vapor deposition process, sputtering process, vacuum evaporation process, spin-coating process, liquid phase deposition process, and thermal oxidation process;
   forming a hole reaching a surface of diffusion layer provided in said semiconductor substrate and/or said lower level wiring in said interlayer insulating film;
   treating said interlayer insulating film including inside surface of said hole by exposing to alkoxyfluorosilane represented by general chemical formula $F_m Si(OR)_{4-m}$ where R is an alkyl radical and m is an integer of 1 to 3; and
   forming an upper level wiring on said interlayer insulating film treated (SiC) said interlayer insulating film.

* * * * *